(12) United States Patent
Long et al.

(10) Patent No.: US 11,454,851 B2
(45) Date of Patent: Sep. 27, 2022

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Chunping Long, Beijing (CN); Yongda Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 734 days.

(21) Appl. No.: 16/336,633

(22) PCT Filed: Jun. 20, 2018

(86) PCT No.: PCT/CN2018/091951
§ 371 (c)(1),
(2) Date: Mar. 26, 2019

(87) PCT Pub. No.: WO2019/037529
PCT Pub. Date: Feb. 28, 2019

(65) Prior Publication Data
US 2021/0305285 A1    Sep. 30, 2021

(30) Foreign Application Priority Data
Aug. 22, 2017  (CN) .......................... 201721052927.5

(51) Int. Cl.
*G02F 1/1345* (2006.01)
*G02F 1/1362* (2006.01)
*H01L 27/12* (2006.01)

(52) U.S. Cl.
CPC ...... *G02F 1/13452* (2013.01); *G02F 1/13454* (2013.01); *G02F 1/13629* (2021.01); *H01L 27/1237* (2013.01); *H01L 27/1244* (2013.01)

(58) Field of Classification Search
CPC ............. G02F 1/13452; G02F 1/13454; G02F 1/1345; G02F 1/13629
See application file for complete search history.

(56) References Cited

U.S. PATENT DOCUMENTS

| 10,283,064 B2 | 5/2019 | Chen |
| 10,311,814 B2 | 6/2019 | Dong et al. |

(Continued)

FOREIGN PATENT DOCUMENTS

| CN | 105427748 A | 3/2016 |
| CN | 105867035 A | 8/2016 |

(Continued)

OTHER PUBLICATIONS

Extended European Search Report in European Patent Application No. 18847741.8 dated Mar. 24, 2021.

(Continued)

*Primary Examiner* — Dung T Nguyen
(74) *Attorney, Agent, or Firm* — Collard & Roe, P.C.

(57) ABSTRACT

An array substrate, a display panel and a display device are disclosed. The array substrate includes a display region and a non-display region around the display region, and further includes: a first leading wire extending from the non-display region to the display region and a second leading wire extending from the non-display region to the display region. The first leading wire is between a first signal line and a first fan-out line and electrically connects the first signal line and the first fan-out line, and the second leading wire is between a second signal line and a second fan-out line and electrically connects the second signal line and the second fan-out line. The first leading wire and the second leading wire are in different layers.

17 Claims, 5 Drawing Sheets

(56) References Cited

U.S. PATENT DOCUMENTS

2015/0263043 A1    9/2015  Chen et al.
2017/0336688 A1    11/2017 Yamamoto et al.
2018/0190225 A1*   7/2018  Chen ................ G02F 1/136286

FOREIGN PATENT DOCUMENTS

| CN | 106647071 A | 5/2017 |
| CN | 106773389 A | 5/2017 |
| CN | 107003580 A | 8/2017 |

OTHER PUBLICATIONS

International Search Report of PCT/CN2018/091951 in Chinese, dated Sep. 29, 2018, with English translation.
Notice of Transmittal of the International Search Report of PCT/CN2018/091951 in Chinese, dated Sep. 29, 2018.
Written Opinion of the International Searching Authority of PCT/CN2018/091951 in Chinese, dated Sep. 29, 2018 with English translation.

* cited by examiner

ARRAY SUBSTRATE, DISPLAY PANEL AND DISPLAY DEVICE

CROSS REFERENCE TO RELATED APPLICATIONS

This application is the National Stage of PCT/CN2018/091951 filed on Jun. 20, 2018, which claims priority under 35 U.S.C. § 119 of Chinese Application No. 201721052927.5 filed on Aug. 22, 2017, the disclosure of which is incorporated by reference.

TECHNICAL FIELD

Embodiments of the present disclosure relate to an array substrate, a display panel and a display device.

BACKGROUND

Due to a series of advantages such as light weight, low energy consumption, small size and the like, liquid crystal display screens have been widely used in consumer electronic products such as mobile phones, laptop computers, personal computers, etc. A liquid crystal display screen generally includes an active matrix array substrate, a color filter substrate and a liquid crystal layer. The active matrix array substrate and the color filter substrate are assembled oppositely, the liquid crystal layer is disposed between the active matrix array substrate and the color filter substrate, and the orientation of liquid crystal molecules in the liquid crystal layer can be adjusted by active components of the active matrix array substrate, that is, intensity of light beam through the liquid crystal layer can be adjusted to display an image.

SUMMARY

At least one embodiment of the present disclosure provides an array substrate, which comprises a display region and a non-display region around the display region, further comprising: a first signal line and a second signal line side by side in the display region, a first fan-out line and a second fan-out line side by side in the non-display region, and a first leading wire extending from the non-display region to the display region and a second leading wire extending from the non-display region to the display region, wherein the first leading wire is between the first signal line and the first fan-out line and electrically connects the first signal line and the first fan-out line, the second leading wire is between the second signal line and the second fan-out line and electrically connects the second signal line and the second fan-out line, and the first leading wire and the second leading wire are in different layers.

For example, in at least one example of the array substrate, where the first leading wire and the first signal line are in different layers, the first leading wire is electrically connected to the first signal line through a first interlayer through hole, and where the first leading wire and the first fan-out line are in different layers, the first leading wire is electrically connected to the first fan-out line through a second interlayer through hole; and where the second leading wire and the second signal line are in different layers, the second leading wire is electrically connected to the second signal line through a third interlayer through hole, and where the second leading wire and the second fan-out line are in different layers, the second leading wire is electrically connected to the second fan-out line through a fourth interlayer through hole.

For example, in at least one example of the array substrate, the first leading wire comprises two first lapping lines and a first connecting line between the two first lapping lines, and the first connecting line electrically connects the two first lapping lines; the second leading wire comprises two second lapping lines and a second connecting line between the two second lapping lines, and the second connecting line electrically connects the two second lapping lines; and the first connecting line and the second connecting line at least partially overlap in a direction perpendicular to the array substrate, and the first connecting line and the second connecting line are insulated from each other.

For example, in at least one example of the array substrate, the first signal line, the second signal line, the first fan-out line, the second fan-out line, and the second leading wire are in a same layer; and a first lapping line at one end of the first leading wire is electrically connected to the first signal line through a first through hole, and a first lapping line at another end of the first leading wire is electrically connected to the first fan-out line through a second through hole.

For example, in at least one example of the array substrate, the first leading wire is in a same layer as the first fan-out line and the second fan-out line, and a first lapping line at one end of the first leading wire is electrically connected to the first signal line through a third through hole; and the second leading wire is in a same layer as the first signal line and the second signal line, and a second lapping line at one end of the second leading wire is electrically connected to the second fan-out line through a fourth through hole.

For example, in at least one example of the array substrate, an extending direction of the first connecting line is parallel to an extending direction of the second connecting line; and a width of the first connecting line in a direction perpendicular to the extending direction of the first connecting line is equal to a width of the second connecting line in a direction perpendicular to the extending direction of the second connecting line.

For example, in at least one example of the array substrate, the first connecting line and the second connecting line completely overlap in the direction perpendicular to the array substrate.

For example, in at least one example of the array substrate, an extending direction of the first lapping line that is connected to the first signal line intersects an extending direction of the second lapping line that is connected to the second signal line; the extending direction of the first lapping line that is connected to the first signal line is parallel to an extending direction of the first signal line; and the extending direction of the second lapping line that is connected to the second signal line is parallel to the extending direction of the second connecting line.

For example, in at least one example of the array substrate, the array substrate further comprises: a first compensation line that is between the first leading wire and the first fan-out line and electrically connects the first leading wire and the first fan-out line, and a second compensation line that is between the second leading wire and the second fan-out line and electrically connects the second leading wire and the second fan-out line, wherein the first compensation line and the first leading wire are in different layers, and the second compensation line and the second leading wire are in different layers.

For example, in at least one example of the array substrate, the first compensation line is electrically connected to the first signal line, and the second compensation line is electrically connected to the second signal line; and the first compensation line is in a same layer as the second leading wire, and the second compensation line is in a same layer as the first leading wire.

For example, in at least one example of the array substrate, the first compensation line is electrically connected to the first leading wire through a fifth interlayer through hole; the second compensation line is electrically connected to the second leading wire through a sixth interlayer through hole; and the first compensation line and the second compensation line partially overlap in the direction perpendicular to the array substrate.

For example, in at least one example of the array substrate, the first compensation line comprises two first lapping parts and a first connecting part between the two first lapping parts, and the first connecting part electrically connects the two first lapping parts; the second compensation line comprises two second lapping parts and a second connecting part between the two second lapping parts, and the second connecting part electrically connects the two second lapping parts; and the first connecting part and the second connecting part at least partially overlap in the direction perpendicular to the array substrate, and the first connecting part and the second connecting part are insulated from each other.

For example, in at least one example of the array substrate, orthographic projections of the first lapping parts and orthographic projections of the second lapping lines of the second leading wire are in an interval arrangement in a panel surface of the array substrate; and orthographic projections of the second lapping parts and orthographic projections of the first lapping lines of the first leading wire are in an interval arrangement in the panel surface of the array substrate.

For example, in at least one example of the array substrate, the first fan-out line and the second fan-out line are side by side along a first direction; the first signal line and the second signal line are side by side along the first direction; the first connecting line of the first leading wire and the second connecting line of the second leading wire extend in a second direction and are side by side in a third direction; and the second direction intersects the first direction, and the third direction is perpendicular to the second direction.

For example, in at least one example of the array substrate, a width of the first connecting line in the third direction is larger than a width of the first signal line in the first direction.

For example, in at least one example of the array substrate, first connecting lines and second connecting lines are in a repetition arrangement in the first direction, and the first connecting lines and the second connecting lines are in an alternate arrangement in the first direction; and a distance between adjacent first connecting lines in the third direction is larger than a distance between the first signal line and the second signal line that are adjacent in the first direction, and a distance between adjacent second connecting lines in the third direction is larger than the distance between the first signal line and the second signal line that are adjacent in the first direction.

For example, in at least one example of the array substrate, the array substrate further comprises data lines, gate lines, a gate insulating layer, and a leading wire insulating layer in different layers, wherein the first signal line and the second signal line are data lines; the first leading wire is in a same layer as the gate lines, and the second leading wire is in a same layer as the data lines; and the leading wire insulating layer is in a same layer as the gate insulating layer, and is between the first leading wire and the second leading wire in the direction perpendicular to the array substrate.

For example, in at least one example of the array substrate, the display region comprises a plurality of display pixels in an array arrangement, and each of the display pixels is electrically connected to at least one signal line.

At least one embodiment of the present disclosure further provides a display panel, comprising any one of the array substrates provided by at least one embodiment of the present disclosure.

At least one embodiment of the present disclosure further provides a display device, comprising any one of the display panels provided by at least one embodiment of the present disclosure.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An active matrix array substrate includes a plurality of gate lines, a plurality of data lines, and a plurality of pixel units which are electrically connected to corresponding gate lines and are electrically connected to corresponding data lines. Wires connected to signal lines such as gate lines, data lines or the like are arranged in edge regions around the active matrix array substrate to connect the signal lines to a bonding pad and to connect the signal lines to a control circuit chip by a bonding process, thereby implementing signal control on the pixel units. Currently, as the resolution of the display panel becomes higher and higher, various signal lines are more concentrated, and thus the arrangement of wires around the array substrate becomes denser and denser.

The inventors of the present disclosure have noted in research that in order to maintain a better electrical conduction and a better uniformity of wires, wide and long wires which are extending in the shape of the letter "S" in a concentrated arrangement can be used. However, this design is unfavorable to the implementation of a narrow frame of the display panel, and the wide and concentrated arrangement of wires makes it easy for short circuit or concentrated circuit break between adjacent signal lines, which tends to cause a decrease in the process yield.

At least one embodiment of the present disclosure provides an array substrate, which comprises a display region and a non-display region around the display region, and further comprises: a first signal line and a second signal line side by side in the display region, a first fan-out line and a second fan-out line side by side in the non-display region, and a first leading wire extending from the non-display region to the display region and a second leading wire extending from the non-display region to the display region. The first leading wire is between the first signal line and the first fan-out line and electrically connects the first signal line and the first fan-out line, the second leading wire is between the second signal line and the second fan-out line and electrically connects the second signal line and the second fan-out line, and the first leading wire and the second leading wire are in different layers.

Hereinafter, the array substrates provided by the embodiments of the present disclosure will be described by specific examples. As described below, in a case without mutual contradiction, different features in these specific examples can be combined with each other to obtain new examples, and these new examples are also in the protection scope of the present disclosure.

As illustrated in FIG. 1 to FIG. 5, the embodiments of the present disclosure provide an array substrate, including a display region 621 and a non display region 622 that is disposed around the display region 621. The array substrate includes a plurality of signal lines which are disposed side by side in the display region 621, a plurality of leading wires in the non-display region 622, and a plurality of fan-out lines 3 which are disposed side by side in the non-display region 622 and are connected to, for example, a control circuit chip (not shown) by such as a bonding pad. For example, the plurality of fan-out lines 3 can be disposed side by side in parallel at an equal interval (for example, disposed side by side in a first direction D1), or can be disposed side by side in a non-parallel arrangement at unequal intervals, such as disposed in a divergent arrangement (for example, extending directions of the plurality of fan-out lines 3 intersect each other). For example, each of the signal lines 1 is connected to a corresponding fan-out line 3 through a corresponding leading wire 2, and is finally connected to the control circuit chip through the corresponding fan-out line 3. The display region, for example, can include display pixels (not shown) in an array arrangement, and each of the display pixels is electrically connected to at least one signal line.

It should be noted that, in some embodiments of the present disclosure, the plurality of leading wires can extend from the non-display region 622 to the display region 621, that is, the leading wires 2 further include portions disposed in the non-display region 622, respectively.

Figure 5:
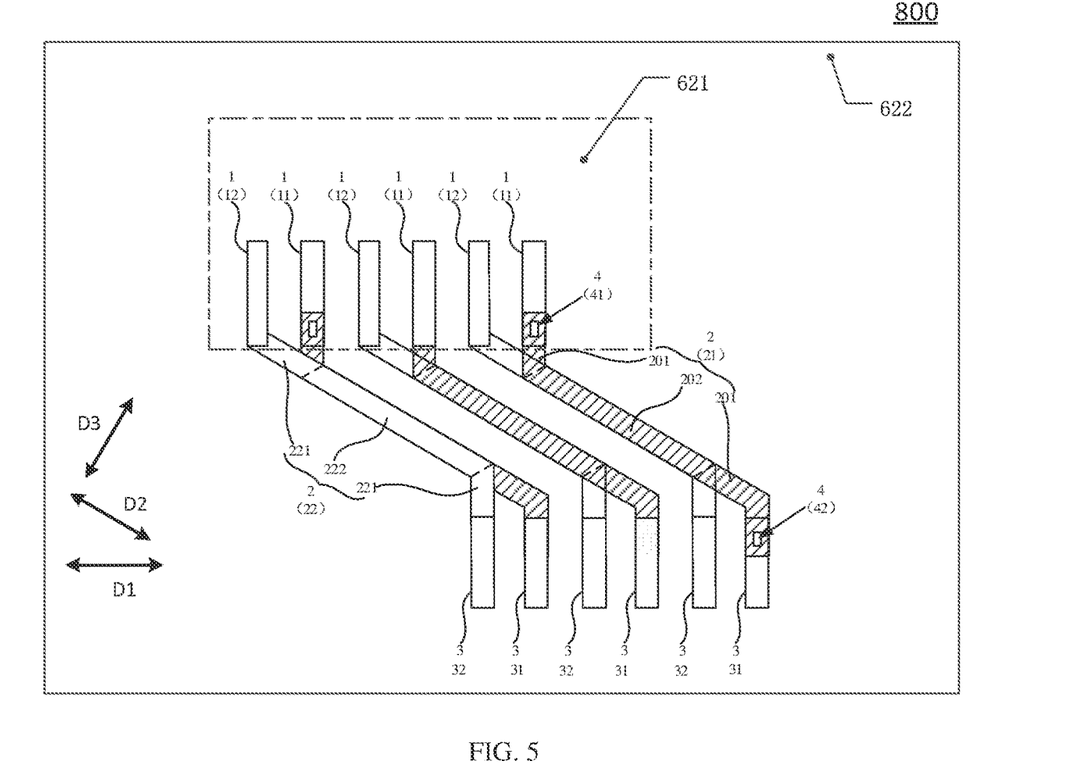
FIG. 5 is a structure schematic diagram of further still another array substrate provided by at least one embodiment of the present disclosure.

The plurality of signal lines 1 described above include a plurality of first signal lines 11 and a plurality of second signal lines 12. As illustrated in FIG. 5, the plurality of first signal lines 11 and the plurality of second signal lines 12 are in an alternate arrangement along an arranging direction of the signal lines 1 (i.e., the first direction D1). In this case, a second signal line 12 can be disposed between two adjacent first signal lines 11, and a first signal line 11 can be disposed between two adjacent second signal lines 12. For example, the first signal lines 11 and the second signal lines 12. The first signal lines 11 and the second signal lines 12 are disposed, for example, in a same layer. The first signal lines 11 and the second signal lines 12, for example, have an identical width and have an identical shape.

Accordingly, the plurality of leading wires 2 described above include a plurality of first leading wires 21 which are corresponding to the plurality of first signal lines 11 and are disposed side by side, and include a plurality of second leading wires 22 which are corresponding to the plurality of second signal lines 12 and are disposed side by side. The plurality of first leading wires 21 described above are disposed in a different layer from the plurality of second leading wires 22.

For example, as illustrated in FIG. 5, the plurality of leading wires 2 can include a plurality of connecting lines 202 which extend in a second direction D2 and are disposed side by side in a third direction D3. The second direction D2 intersects the first direction D1, and the third direction D3 is perpendicular to the second direction D2.

Figure 1A:
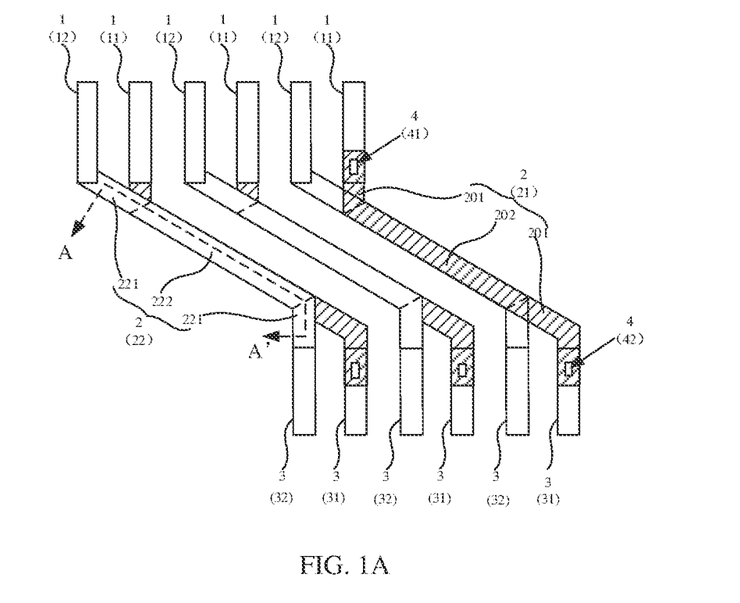
FIG. 1A is a structure schematic diagram of an array substrate provided by at least one embodiment of the present disclosure.
Figure 1B:
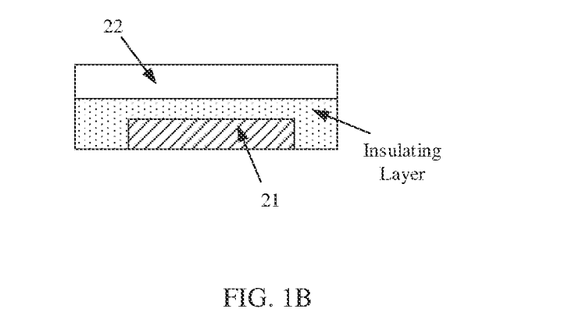
FIG. 1B is a cross-sectional diagram of the array substrate illustrated in FIG. 1A along a line AA'.

As illustrated in FIG. 1, the plurality of fan-out lines 3 described above include a plurality of first fan-out lines 31 and a plurality of second fan-out lines 32 in an alternate arrangement in the first direction D1, and the plurality of first fan-out lines 31 and the plurality of second fan-out lines 32 are disposed, for example, in a same layer. For example, the plurality of first fan-out lines 31 and the plurality of second fan-out lines 32 can have an identical structure.

In the array substrate described above, the signal lines 1 which are disposed side by side include the plurality of first signal lines 11 and the plurality of second signal lines 12, each of the first signal lines 11 is connected to a corresponding fan-out line 3 through a corresponding first leading wire 21, and each of the second signal lines 12 is connected to a corresponding fan-out line 3 through a corresponding second leading wire 22. For example, as illustrated in FIG. 1, a first leading wire 21 is disposed between a first signal line 11 and a first fan-out line 31, and electrically connects the first signal line 11 and the first fan-out line 31; and a second leading wire 22 is disposed between a second signal line 12 and a second fan-out line 32, and electrically connects the second signal line 12 and the second fan-out line 32. The first leading wire 21 is disposed in a different layer from the second leading wire 22.

Because the first leading wire 21 and the second leading wire 22 are respectively disposed in different layers, the first leading wire 21 and the second leading wire 22 can at least partially overlap in a direction perpendicular to the array substrate. Therefore, a width of the first leading wire 21 (for example, a width of the connecting line of the first leading wire 21 in the third direction D3) and a width of the second leading wire 22 (for example, a width of the connecting line of the second leading wire 22 in the third direction D3) can be larger than a width of the signal lines 1 (the width in the first direction D1) and a width of the fan-out lines 3 (the width in the first direction D1). A distance between adjacent first leading wires 21 (for example, a distance between axes of symmetry, which are in the third direction, of the first connecting lines 202 of the adjacent first leading wires 21 in the third direction D3) and a distance between adjacent second leading wires 22 (for example, a distance between axes of symmetry, which are in the third direction, of the second connecting lines 222 of the adjacent second leading wires 22 in the third direction D3) can be larger than a distance between adjacent signal lines 1 (a distance between an axis of symmetry, which is in the first direction D1, of the first signal line 11 and an axis of symmetry, which is in the first direction D1, of the adjacent second signal line 12 in the first direction D1), and can also be larger than a distance between adjacent fan-out lines 3 (a distance between an axis of symmetry, which is in the first direction D1, of the first fan-out line 31 and an axis of symmetry, which is in the first direction D1, of the adjacent second fan-out line 32 in the first direction D1). Therefore, the array substrate provided by the embodiments of the present disclosure facilitates a concentrated design of the signal lines 1.

Moreover, the increase in the width of the leading wires 2 can reduce the electric resistance of the leading wires 2 and can improve the uniformity of the leading wires 2. The increase in the distance between adjacent leading wires 2 facilitates reduction of the probability of short circuit between the leading wires 2, thereby contributing to improvement of the process yield of the array substrate.

In addition, the alternate arrangement of the plurality of first signal lines 11 and the plurality of second signal lines 12 can facilitate the regularity and uniformity of the arrangement of the plurality of first leading wires 21 and the plurality of second leading wires 22, thereby further improving the uniformity of the leading wires 2 and thus facilitating the improvement of the process yield of the array substrate.

In summary, the array substrate described above facilitates a high resolution and a narrow frame design of the display panel, and the array substrate can have lower leading wire electric resistance, better uniformity of leading wires, a lower probability of short circuit between wires, and a higher process yield.

In at least one example of the embodiments of the present disclosure, the plurality of signal lines 1 and the plurality of fan-out lines 3 can be disposed in a same layer. In this case, the plurality of signal lines 1 and the plurality of fan-out lines 3 can be disposed in a same layer as the second leading wires 22 (referring to FIG. 1 and FIG. 3), or can be disposed in a same layer as the first leading wires 21 (not shown).

Figure 2:
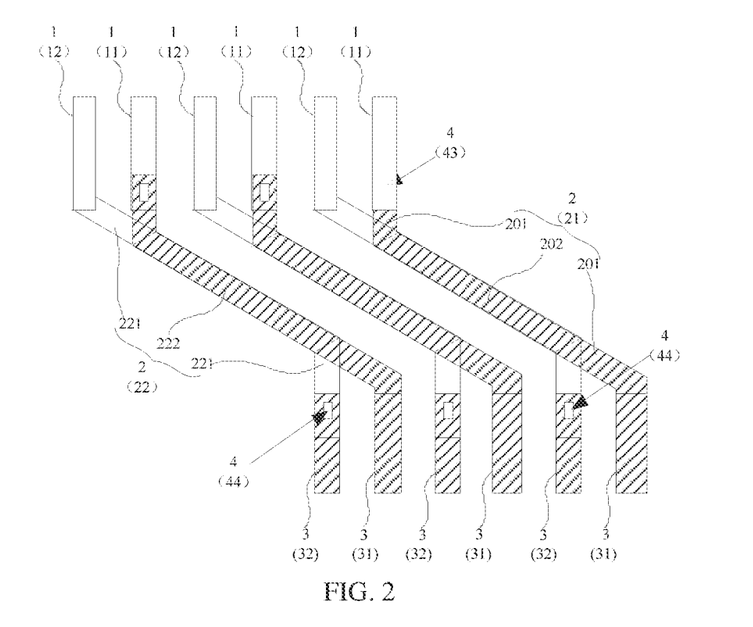
FIG. 2 is a structure schematic diagram of another array substrate provided by at least one embodiment of the present disclosure.
Figure 4:
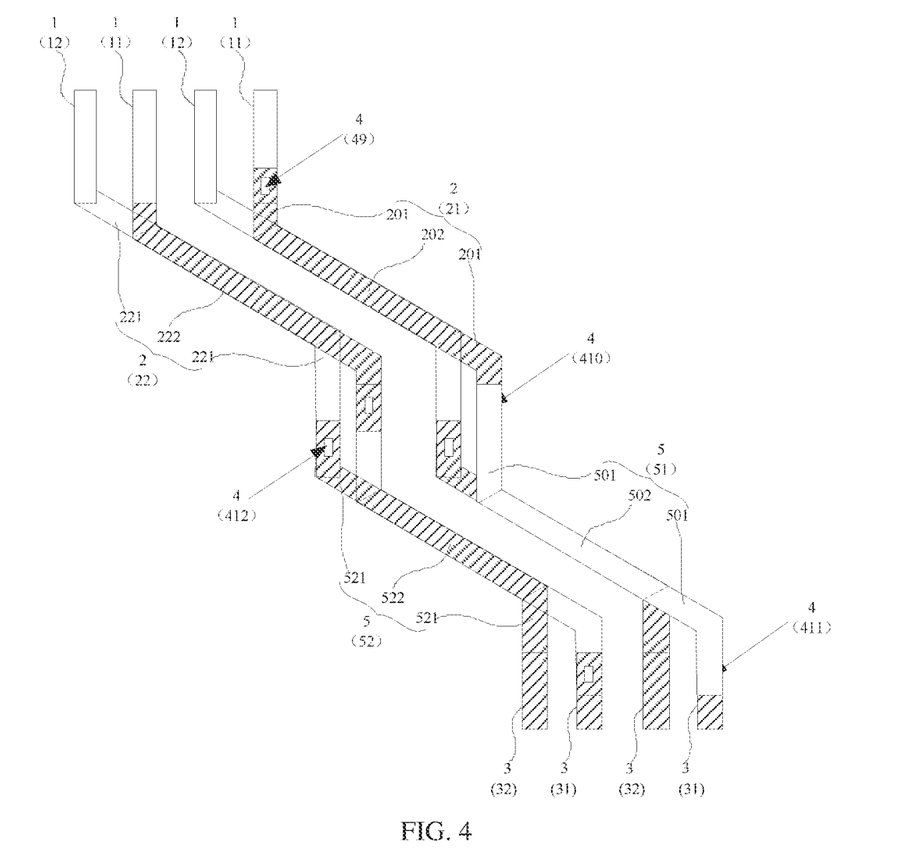
FIG. 4 is a structure schematic diagram of further still another array substrate provided by at least one embodiment of the present disclosure.

In at least one example of the embodiments of the present disclosure, the plurality of signal lines 1 and the plurality of fan-out lines 3 can be disposed in different layers. In this case, for example, as illustrated in FIG. 2 and FIG. 4, the first leading wires 21 can be disposed in a same layer as the plurality of fan-out lines 3 (the first fan-out lines 31 and the second fan-out lines 32), and the second leading wires 22 can be disposed in a same layer as the plurality of signal lines 1 (the first signal lines 11 and the second signal lines 12); and for example, the first leading wires 21 can be disposed in a same layer as the plurality of signal lines 1, and the second leading wires 22 can be disposed in a same layer as the plurality of fan-out lines 3.

Hereinafter, the array substrates provided by the embodiments of the present disclosure will be exemplified by taking the circuit layer where the first leading wire 21 is disposed as a first circuit layer (the structure layer illustrated by oblique lines in FIG. 1 to FIG. 4) and by taking the circuit layer where the second leading wire 22 is disposed as a second circuit layer (the structure layer illustrated by a solid color in FIG. 1 to FIG. 4).

As illustrated in FIG. 1 to FIG. 4, in a specific example, in the array substrates provided by the embodiments of the present disclosure, an insulating layer is disposed between different circuit layers (for example, between the first circuit layer and the second circuit layer), and through holes 4 are disposed in the insulating layer between different circuit layers to implement an interlayer connection (for example, to electrically connect wires or lines in different circuit layers). For example, at least one of a first interlayer through hole, a second interlayer through hole, a third interlayer through hole, a fourth interlayer through hole, a fifth interlayer through hole (for example, a through hole 410), and a sixth interlayer through hole (for example, a through hole 412) can be disposed in the insulating layer.

For example, where a first leading wire 21 and a first signal line 11 are disposed in different layers, the first leading wire 21 and the first signal line 11 can be connected through a first interlayer through hole (for example, a through hole 41); and where the first leading wire 21 and a fan-out line 3 are disposed in different layers, the first leading wire 21 and the fan-out line 3 (the first fan-out line 31) can be connected through a second interlayer through hole (for example, a through hole 42).

For example, where a second leading wire 22 and a second signal line 12 are disposed in different layers, the second leading wire 22 and the second signal line 12 can be connected through a third interlayer through hole (not shown); and where the second leading wire 22 and a fan-out line 3 are disposed in different layers, the second leading wire 22 and the fan-out line 3 (the second fan-out line 32) can also be connected through a fourth interlayer through hole (for example, a through hole 44).

As illustrated in FIG. 1 to FIG. 4, on the basis of the embodiments described above, in a specific example, each of the leading wires 2 can include two lapping lines which are respectively at two ends of the leading wire 2, and include a connecting line which is between the two lapping lines and is connected to the two lapping lines. The two lapping lines and the connecting line can be integrally formed, for example, formed in the same mask process.

For example, as illustrated in FIG. 1, the first leading wire 21 includes two first lapping lines 201 and the first connecting line 202 that is between the two first lapping lines 201 and electrically connects the two first lapping lines 201; and the second leading wire 22 includes two second lapping lines 221 and the second connecting line 222 that is between the two second lapping lines 221 and electrically connects the two second lapping lines 221.

The two lapping lines of the leading wires are respectively connected to the signal lines 1 and the fan-out lines 3. For example, the two lapping lines of a first leading wire 21 are respectively connected to a first signal line 11 and a corresponding fan-out line 3, and the two lapping lines of a second leading wire 22 are respectively connected to a second signal line 12 and a corresponding fan-out line 3.

As illustrated in FIG. 1, the first connecting line 202 and the second connecting line 222 can overlap to facilitate increasing the width of the leading wires 2 and the distance between adjacent leading wires 2, and improving the process yield of the array substrate.

For example, as illustrated in FIG. 1, an extending direction of the first connecting line 202 can be parallel to an extending direction of the second connecting line 222. A width of the first connecting line 202 in a direction perpendicular to the extending direction of the first connecting line 202 is equal to a width of the second connecting line 222 in a direction perpendicular to the extending direction of the second connecting line 222.

For example, as illustrated in FIG. 1, the first connecting line 202 and the second connecting line 222 can completely overlap in the direction perpendicular to the array substrate.

For example, as illustrated in FIG. 1, an extending direction of the first lapping line 201 that is connected to the first signal line 11 intersects an extending direction of the second lapping line 221 that is connected to the second signal line 12. The extending direction of the first lapping line 201 that is connected to the first signal line 11 is parallel to an extending direction of the first signal line 11. The extending direction of the second lapping line 221 that is connected to the second signal line 12 is parallel to the extending direction of the second connecting line 222.

Figure 3:
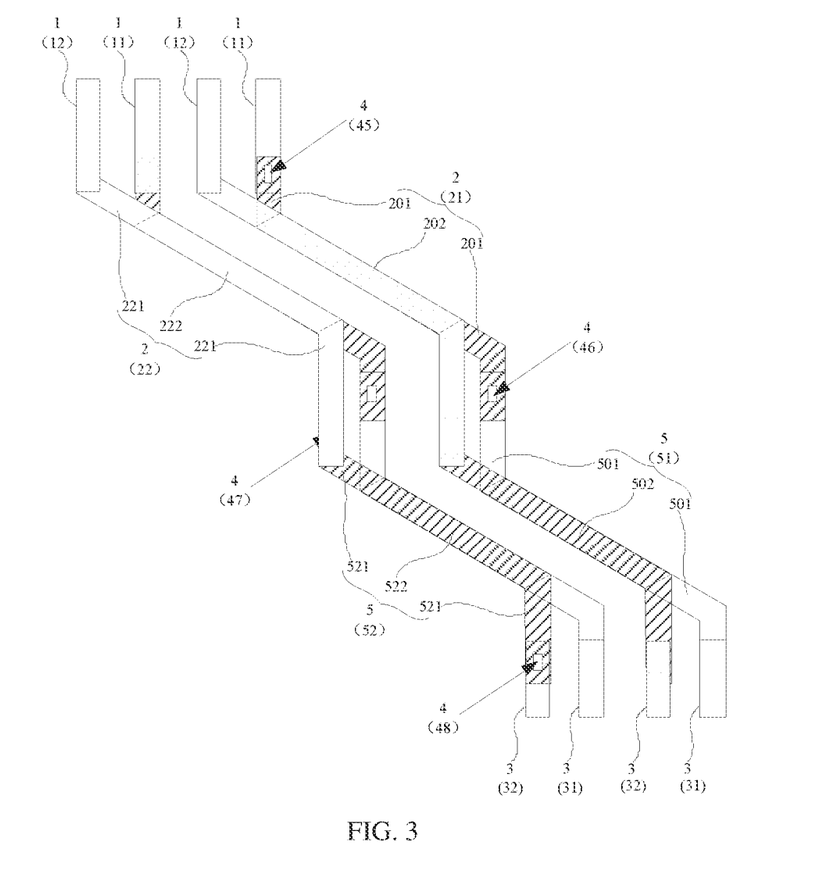
FIG. 3 is a structure schematic diagram of further still another array substrate provided by at least one embodiment of the present disclosure.

For example, as illustrated in FIG. 1 and FIG. 3, the plurality of signal lines 1 (the first signal lines 11 and the second signal lines 12) and the plurality of fan-out lines 3 (the first fan-out lines 31 and the second fan-out lines 32) can be disposed in a same layer. For another example, as illustrated in FIG. 2 and FIG. 4, the plurality of signal lines 1 and the plurality of fan-out lines 3 can also be disposed in different layers.

For example, as illustrated in FIG. 1, in a case where the plurality of signal lines 1 and the plurality of fan-out lines 3 are disposed in the same layer, the plurality of signal lines 1 and the plurality of fan-out lines 3 are in the same layer as the second leading wire 22, that is, the plurality of signal lines 1 and the plurality of fan-out lines 3 are in the second circuit layer as the second leading wire 22, and the first leading wire 21 is in the first circuit layer. In this case, the lapping line 201 at one end of a first leading wire 21 can be electrically connected to a first signal line 11 through a first through hole 41 between the first circuit layer and the second circuit layer, and the lapping line 201 at another end of the first leading wire 21 can be electrically connected to a fan-out line 3 through a second through hole 42 between the first circuit layer and the second circuit layer.

For example, as illustrated in FIG. 2, in a case where the plurality of signal lines 1 and the plurality of fan-out lines 3 are disposed in different layers, the plurality of signal lines 1 and the second leading wires 22 are disposed in the same layer, and the plurality of fan-out lines 3 and the first leading wires 21 are disposed in the same layer, that is, the plurality of signal lines 1 and the second leading wires 22 are in the second circuit layer, and the plurality of fan-out lines 3 and the first leading wires 21 are in the first circuit layer. In this case, the lapping line 201 at one end of a first leading wire 21 can be electrically connected to a first signal line 11 through a third through hole 43 between the first circuit layer and the second circuit layer, and the lapping line 201 at one end of the second leading wire 22 can be electrically connected to a fan-out line 3 through a fourth through hole 44 between the first circuit layer and the second circuit layer.

For example, as illustrated in FIG. 3 and FIG. 4, the array substrates provided by the embodiments of the present disclosure can further include a plurality of compensation lines 5 which are respectively between the plurality of leading wires 2 and the plurality of fan-out lines 3 and are respectively corresponding to the plurality of leading wires 2. Each of the compensation lines 5 is connected between a corresponding leading wire 2 and a corresponding fan-out line 3, and connects the leading wire 2 and the fan-out line 3 which are corresponding to the compensation line 5. Each compensation line 5 and the leading wire 2 connected to this compensation line are disposed in different layers.

For example, the plurality of compensation lines 5 include a first compensation line 51 which is electrically connected to a first signal line 11, and a second compensation line 52 which is electrically connected to a second signal line 12. The first compensation line 51 is between a first leading wire 21 and a first fan-out line 31 and electrically connects the first leading wire 21 and the first fan-out line 31, and the second compensation line 52 is between a second leading wire 22 and a second fan-out line 32, and electrically connects the second leading wire 22 and the second fan-out line 32, that is, the wire connected to the first signal line 11 includes the first leading wire 21, the first compensation line 51 and the fan-out line 3 in turn, and the wire connected to the second signal line 12 includes the second leading wire 22, the second compensation line 52 and the fan-out line 3 in turn. For example, in a case where the plurality of signal lines 1 include the plurality of first signal lines 11 and the plurality of second signal lines 12, the plurality of compensation lines 5 include a plurality of first compensation lines 51 and a plurality of second compensation lines 52, the plurality of first compensation lines 51 are corresponding to the plurality of first signal lines 11 in a one-to-one correspondence relationship, and the plurality of second compensation lines 52 are corresponding to the plurality of second signal lines 12 in a one-to-one correspondence relationship.

As illustrated in FIG. 3 and FIG. 4, the first compensation lines 51 and the first leading wires 21 are disposed in different layers, and the second compensation lines 52 and the second leading wires 22 are disposed in different layers. For example, the first compensation lines 51 and the second leading wires 22 are disposed in a same layer, and the second compensation lines 52 and the first leading wires 21 are disposed in a same layer, that is, the first compensation lines 51 and the second leading wires 22 are both in the second circuit layer, and the second compensation lines 52 and the first leading wires 21 are both in the first circuit layer. Therefore, the difference between the electric resistance of the first leading wires 21 and the electric resistance of the second leading wires 22 can be compensated by the first compensation lines 51 and the second compensation lines 52, so as to allow the electric resistance of wires connected to the first signal lines 11 and the second signal lines 12 to be more uniform.

For example, a first compensation line 51 can be electrically connected to a first leading wire 21 through one of the through holes 4 which are disposed between the first circuit layer and the second circuit layer. Correspondingly, a second compensation line 52 can also be electrically connected to a second leading wire 22 through one of the through holes 4 which are disposed between the first circuit layer and the second circuit layer. Similarly to the arrangement of the first leading wire 21 and the second leading wire 22, the first compensation lines 51 and the second compensation lines 52 can also be connected to other lines or wires through corresponding lapping lines 501.

As illustrated in FIG. 3 and FIG. 4, each of the compensation lines 5 includes two lapping parts and a connecting part that is between the two lapping parts and is connected to the two lapping parts.

As illustrated in FIG. 3 and FIG. 4, a first compensation line 51 includes two first lapping parts 501 and a first connecting part 502 that is between the two first lapping parts 501 and electrically connects the two first lapping parts 501. A second compensation line 52 includes two second lapping parts 521 and a second connecting part 522 that is between the two second lapping parts 521 and electrically connects the two second lapping parts 521. The connecting parts (the first connecting part 502 and the second connecting part 522) which are the intermediate parts of the first compensation line 51 and the second compensation line 52 can at least partially overlap in the direction perpendicular to the array substrate and can be insulated from each other, so as to improve the width of the compensation lines 5 and the distance between adjacent compensation lines 5, and to improve the process yield of the array substrate.

For example, as illustrated in FIG. 3, orthographic projections of the first lapping parts 501 of the first compensation line 51 and orthographic projections of the second lapping lines 221 of the second leading wire 22 are in an interval arrangement in a panel surface of the array substrate to avoid an electrical connection of the first compensation line 51 and the second leading wire 22. Orthographic projections of the second lapping parts 521 of the second compensation line 52 and orthographic projections of the first lapping lines 201 of the first leading wire 21 are in an interval arrangement in the panel surface of the array substrate to avoid an electrical connection of the second compensation line 52 and the first leading wire 21. For example, as illustrated in FIG. 3, an extending direction of the first lapping parts 501 of the first compensation line 51 can be parallel to an extending direction of the second lapping lines 221 of the second leading wire 22.

For example, as illustrated in FIG. 3, in the array substrate provided by the embodiment of the present disclosure, the plurality of signal lines 1 and the plurality of fan-out lines 3 are disposed in the same layer as the second leading wire 22 and the first compensation line 51, and the first leading wire 21 and the second compensation line 52 are disposed in the same layer, that is, the plurality of signal lines 1, the plurality of fan-out lines 3, the second leading wire 22, and the first compensation line 51 are in the second circuit layer, and the first leading wire 21 and the second compensation line 52 are in the first circuit layer. Further, in the wire path of the first signal line 11, a fifth through hole 45 needs to be disposed between the first circuit layer and the second circuit layer to allow the first leading wire 21 and the first signal line 11 to be in an interlayer connection, and a sixth through hole 46 needs to be disposed between the first circuit layer and the second circuit layer to allow the first leading wire 21 and the first compensation line 51 to be in an interlayer connection, respectively. Similarly, in the wire path of the second signal line 12, a seventh through hole 47 needs to be disposed to allow the second leading wire 22 and the second compensation line 52 to be in an interlayer connection, and an eighth through hole 48 needs to be disposed to allow the second compensation line 52 and the fan-out line 3 to be in an interlayer connection, respectively.

For example, as illustrated in FIG. 4, in the array substrate provided by the embodiments of the present disclosure, the plurality of signal lines 1 are disposed in the same layer as the second leading wire 22 and the first compensation line 51, and the plurality of fan-out lines 3 are disposed in the same layer as the first leading wire 21 and the second compensation line 52, that is, the plurality of signal lines 1, the second leading wire 22, and the first compensation line 51 are in the second circuit layer, and the plurality of fan-out lines 3, the first leading wire 21 and the second compensation line 52 are in the first circuit layer. Further, in the wire path of the first signal line 11, a ninth through hole 49 needs to be disposed to allow the first leading wire 21 and the first signal line 11 to be in an interlayer connection, a tenth through hole 410 needs to be disposed to allow the first leading wire 21 and the first compensation line 51 to be in an interlayer connection, and an eleventh through hole 411 needs to be disposed to allow the first compensation line 51 and the fan-out line 3 to be in an interlayer connection, respectively. In the wire path of the second signal line 12, a twelfth through hole 412 needs to be disposed to allow the second leading wire 22 and the second compensation line 52 to be in an interlayer connection.

For example, in the array substrate provided by the embodiments of the present disclosure, the array substrate further includes data lines, gate lines, a gate insulating layer, and a leading wire insulating layer (not shown), and the data lines, the gate lines, the gate insulating layer, and the leading wire insulating layer are disposed in different layers.

For example, the signal lines 1 can be implemented as the data lines. For example, the first leading wires 21 can be in the same layer as the gate lines, and the second leading wires 22 can be in the same layer as the data lines, that is, the first circuit layer is a gate line layer, and the second circuit layer is a data line layer. In this case, the leading wire insulating layer can be disposed in a same layer as the gate insulating layer and be disposed between the first leading wires 21 and the second leading wires 22 in the direction perpendicular to the array substrate.

For example, the signal lines 1 can also be implemented as the gate lines. For example, the first leading wires 21 can be in the same layer as the data lines, and the second leading wires 22 can be in the same layer as the gate lines, that is, the first circuit layer is a data line layer, and the second circuit layer is a gate line layer. Similarly, in this case, the leading wire insulating layer can also be disposed in the same layer as the gate insulating layer and be disposed between the first leading wires 21 and the second leading wires 22 in the direction perpendicular to the array substrate.

For example, the materials for fabricating the gate lines and the data lines can be copper, aluminum, aluminum alloy or other suitable materials, and the material for fabricating the gate insulating layer can be silicon oxide (SiOx), silicon oxynitride (SiNxOy), silicon nitride (SiNx) or other suitable material.

For example, the signal lines 1, the leading wires 2, and the fan-out lines 3 can be made of the same material. For example, the signal lines 1, the leading wires 2, and the fan-out lines 3 can be made of a metal material (for example, copper, aluminum, or aluminum alloy) to reduce electric resistance, but the embodiments of the present disclosure are not limited thereto. According to actual application requirements, the signal lines 1, the leading wires 2, and the fan-out lines 3 can also be made of a transparent conductive material, for example, indium tin oxide (ITO) or indium zinc oxide (IZO).

It should be noted that, in the embodiments of the present disclosure, the wires which are disposed in the same layer can be made of the same material and be formed in the same process to simplify the manufacturing process. For example, in the case where the first leading wires 21 and the gate lines are in the same layer, the first leading wires 21 and the gate lines can be made of the same material, but the embodiments of the present disclosure are not limited thereto.

The embodiments of the present disclosure further provide a display panel 801, and as illustrated in FIG. 5, the display panel 801 includes any one of the array substrates 800 provided by the embodiments of the present disclosure.

Figure 6:
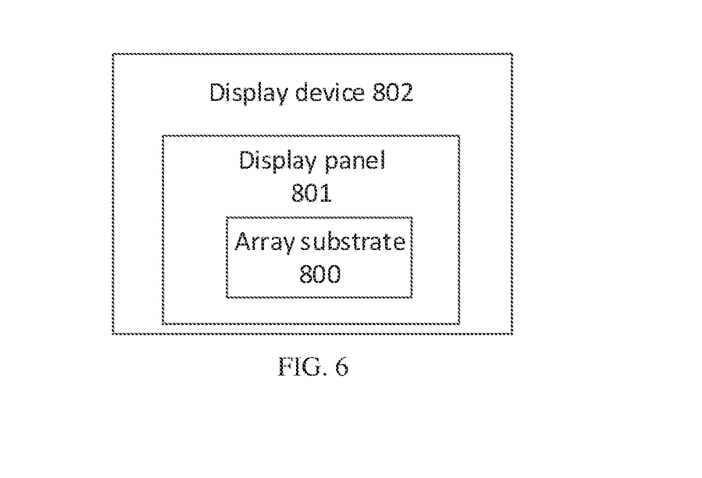
FIG. 6 is an exemplary block diagram of a display panel and a display device provided by at least one embodiment of the present disclosure.

The embodiments of the present disclosure further provide a display device 802, and as illustrated in FIG. 6, the display device 802 includes any one of the display panels 801 provided by the embodiments of the present disclosure.

It should be noted that suitable components can be used for other necessary components (such as a control device, an image data encoding/decoding device, a row scanning driver, a column scanning driver, a clock circuit, etc.) of the display panel 801 and the display device 802. It should be understood by those skilled in the art and will not be described herein, and it should not be limitative of the embodiments of the present disclosure.

It should be noted that the display panel 801 can be a liquid crystal display panel or an organic light-emitting diode display panel. In a case where the display panel 801 is the organic light-emitting diode display panel, the display panel 801 can include a plurality of sub-pixels in an array arrangement, each of the sub-pixels includes one pixel circuit, and the first signal lines and the second signal lines can be light-emitting controlling lines of the pixel circuit, sensing lines of the pixel circuit or the like.

The display panel and the display device provided by the embodiments of the present disclosure facilitate the realization of high resolution and narrow frame, and the process yield of preparation is high.

It should be noted that, in order to clearly illustrate the embodiments of the present disclosure, the dimension scale of partial structures in the accompanying drawings may be inconsistent with respect to the dimension scale in actual products, for example, may be appropriately enlarged, and the dimension scale of partial structures may also be smaller than the dimension scale in actual products, that is, dimension scales of structures in the accompanying drawings do not represent dimension scales of the real structures.

Although detailed description has been given above to the present disclosure with general description and specific embodiments, it shall be apparent to those skilled in the art that some modifications or improvements may be made on the basis of the embodiments of the present disclosure. Therefore, all the modifications or improvements made without departing from the spirit of the present disclosure shall all fall within the protection scope of the present disclosure.

What have been described above are only specific implementations of the present disclosure, the protection scope of the present disclosure is not limited thereto, the modification or replacement that are easily conceived by those skilled in the related art in the technical scope of the present disclosure should be in the protection scope of the present disclosure, and the protection scope of the present disclosure should be based on the protection scope of the claims.

What is claimed is:

1. An array substrate, which comprises a display region and a non-display region around the display region, further comprising:
    a first signal line and a second signal line side by side,
    a first fan-out line and a second fan-out line side by side in the non-display region, and
    a first leading wire extending from the non-display region to the display region and a second leading wire extending from the non-display region to the display region,
    wherein the first leading wire is between the first signal line and the first fan-out line, and electrically connects the first signal line and the first fan-out line,
    the second leading wire is between the second signal line and the second fan-out line, and electrically connects the second signal line and the second fan-out line, and the first leading wire and the second leading wire are in different layers;
    the first leading wire comprises two first lapping lines and a first connecting line between the two first lapping lines, and the first connecting line electrically connects the two first lapping lines;
    the second leading wire comprises two second lapping lines and a second connecting line between the two second lapping lines, and the second connecting line electrically connects the two second lapping lines;
    the first connecting line and the second connecting line are insulated from each other; and
    the first connecting line and the second connecting line completely overlap in a direction perpendicular to the array substrate.

2. An array substrate, which comprises a display region and a non-display region around the display region, further comprising:
    a first signal line and a second signal line side by side,
    a first fan-out line and a second fan-out line side by side in the non-display region, and
    a first leading wire extending from the non-display region to the display region and a second leading wire extending from the non-display region to the display region,
    wherein the first leading wire is between the First signal line and the First fan-out line, and electrically connects the first signal line and the first fan-out line,
    the second leading wire is between the second signal line and the second fan-out line, and electrically connects the second signal line and the second fan-out line, and the first leading wire and the second leading wire are in different layers;
    the first leading wire comprises two first lapping lines and a first connecting line between the two first lapping lines, and the first connecting line electrically connects the two first lapping lines;
    the second leading wire comprises two second lapping lines and a second connecting line between the two second lapping lines, and the second connecting line electrically connects the two second lapping lines;
    the first connecting line and the second connecting line at least partially overlap in a direction perpendicular to the array substrate, and the first connecting line and the second connecting line are insulated from each other;
    the first fan-out line and the second fan out line are side by side along a first direction;
    the first signal line and the second signal line are side by side along the first direction;
    the first connecting line of the first leading wire and the second connecting line of the second leading wire extend in a second direction and are side by side in a third direction;

the second direction intersects the first direction, and the third direction is perpendicular to the second direction; and a width of the first connecting line in the third direction is larger than a width of the first signal line in the first direction.

3. The array substrate according to claim 2, wherein first connecting lines and second connecting lines are in a repetition arrangement in the first direction, and the first connecting lines and the second connecting lines are in an alternate arrangement in the first direction; and a distance between adjacent first connecting lines in the third direction is larger than a distance between the first signal line and the second signal line that are adjacent in the first direction, and a distance between adjacent second connecting lines in the third direction is larger than the distance between the first signal line and the second signal line that are adjacent in the first direction.

4. The array substrate according to claim 2, wherein the display region comprises a plurality of display pixels in an array arrangement, and each of the display pixels is electrically connected to at least one signal line.

5. A display panel, comprising the array substrate according to claim 2.

6. A display device, comprising the display panel according to claim 5.

7. The array substrate according to claim 2, wherein where the first leading wire and the first signal line are in different layers, the first leading wire is electrically connected to the first signal line through a first interlayer through hole, and where the first leading wire and the first fan-out line are in different layers, the first leading wire is electrically connected to the first fan-out line through a second interlayer through hole; and where the second leading wire and the second signal line are in different layers, the second leading wire is electrically connected to the second signal line through a third interlayer through hole, and where the second leading wire and the second fan-out line are in different layers, the second leading wire is electrically connected to the second fan-out line through a fourth interlayer through hole.

8. The array substrate according to claim 2, wherein the first signal line, the second signal line, the first fan-out line, the second fan-out line, and the second leading wire are in a same layer; and a first lapping line at one end of the first leading wire is electrically connected to the first signal line through a first through hole, and a first lapping line at another end of the first leading wire is electrically connected to the first fan-out line through a second through hole.

9. The array substrate according to claim 2, wherein the first leading wire is in a same layer as the first fan-out line and the second fan-out line, and a first lapping line at one end of the first leading wire is electrically connected to the first signal line through a third through hole; and the second leading wire is in a same layer as the first signal line and the second signal line, and a second lapping line at one end of the second leading wire is electrically connected to the second fan-out line through a fourth through hole.

10. The array substrate according to claim 2, wherein an extending direction of the first connecting line is parallel to an extending direction of the second connecting line; and a width of the first connecting line in a direction perpendicular to the extending direction of the first connecting line is equal to a width of the second connecting line in a direction perpendicular to the extending direction of the second connecting line.

11. The array substrate according to claim 2, wherein the first connecting line and the second connecting line completely overlap in the direction perpendicular to the array substrate.

12. The array substrate according to claim 2, wherein an extending direction of the first lapping line that is connected to the first signal line intersects an extending direction of the second lapping line that is connected to the second signal line;

the extending direction of the first lapping line that is connected to the first signal line is parallel to an extending direction of the first signal line; and the extending direction of the second lapping line that is connected to the second signal line is parallel to the extending direction of the second connecting line.

13. The array substrate according to claim 2, further comprising:

a first compensation line that is between the first leading wire and the first fan-out line and electrically connects the first leading wire and the first fan-out line, and a second compensation line that is between the second leading wire and the second fan-out line and electrically connects the second leading wire and the second fan-out line, wherein the first compensation line and the first leading wire are in different layers, and the second compensation line and the second leading wire are in different layers.

14. The array substrate according to claim 13, wherein the first compensation line is electrically connected to the first signal line, and the second compensation line is electrically connected to the second signal line; and the first compensation line is in a same layer as the second leading wire, and the second compensation line is in a same layer as the first leading wire.

15. The array substrate according to claim 14, wherein the first compensation line is electrically connected to the first leading wire through a fifth interlayer through hole;

the second compensation line is electrically connected to the second leading wire through a sixth interlayer through hole; and the first compensation line and the second compensation line partially overlap in the direction perpendicular to the array substrate.

16. The array substrate according to claim 14, wherein the first compensation line comprises two first lapping parts and a first connecting part between the two first lapping parts, and the first connecting part electrically connects the two first lapping parts;

the second compensation line comprises two second lapping parts and a second connecting part between the two second lapping parts, and the second connecting part electrically connects the two second lapping parts; and the first connecting part and the second connecting part at least partially overlap in the direction perpendicular to the array substrate, and the first connecting part and the second connecting part are insulated from each other.

17. The array substrate according to claim 16, wherein orthographic projections of the first lapping parts and orthographic projections of the second leading wire are in an interval arrangement in a panel surface of the array substrate; and orthographic projections of the second lapping parts and orthographic projections of the first leading wire are in an interval arrangement in the panel surface of the array substrate.

\* \* \* \* \*